(12) United States Patent
Hong et al.

(10) Patent No.: US 8,942,004 B2
(45) Date of Patent: Jan. 27, 2015

(54) PRINTED CIRCUIT BOARD HAVING ELECTRONIC COMPONENTS EMBEDDED THEREIN

(75) Inventors: Suk Chang Hong, Chungcheongbuk-do (KR); Bong Kyu Choi, Chungcheongbuk-do (KR); Je Gwang Yoo, Gyunggi-do (KR); Sang Wuk Jun, Chungcheoungbuk-do (KR); Sang Kab Park, Chungcheoungbuk-do (KR); Jung Soo Byun, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 266 days.

(21) Appl. No.: 12/972,371

(22) Filed: Dec. 17, 2010

(65) Prior Publication Data
US 2012/0087097 A1 Apr. 12, 2012

(30) Foreign Application Priority Data

Oct. 7, 2010 (KR) .................... 10-2010-0097930

(51) Int. Cl.
| | |
|---|---|
| H05K 1/18 | (2006.01) |
| H01L 23/538 | (2006.01) |
| H05K 3/46 | (2006.01) |
| H01L 23/00 | (2006.01) |
| H01L 23/498 | (2006.01) |

(52) U.S. Cl.
CPC ............ *H05K 1/185* (2013.01); *H01L 23/5389* (2013.01); *H05K 3/4608* (2013.01); *H01L 24/19* (2013.01); *H01L 24/24* (2013.01); *H01L 23/49827* (2013.01); *H05K 3/4661* (2013.01); *H01L 2924/01012* (2013.01); *H01L 2924/01029* (2013.01); *H01L 2224/73267* (2013.01); *H01L 2224/04105* (2013.01); *H01L 2224/32225* (2013.01); *H01L 2224/32245* (2013.01); *H01L 2924/15153* (2013.01)
USPC ............ 361/763; 361/764; 361/766; 361/795; 174/262; 174/264

(58) Field of Classification Search
USPC ............ 361/763–766, 792–795, 803; 174/259–262
See application file for complete search history.

(56) References Cited

U.S. PATENT DOCUMENTS

| | | | | |
|---|---|---|---|---|
| 5,432,677 | A * | 7/1995 | Mowatt et al. | 361/719 |
| 5,875,100 | A * | 2/1999 | Yamashita | 361/764 |
| 6,724,638 | B1 * | 4/2004 | Inagaki et al. | 361/763 |
| 6,822,170 | B2 * | 11/2004 | Takeuchi et al. | 174/258 |
| 7,312,405 | B2 * | 12/2007 | Hsu | 174/262 |
| 7,889,509 | B2 * | 2/2011 | Urashima et al. | 361/760 |
| 2004/0001324 | A1 * | 1/2004 | Ho et al. | 361/761 |
| 2006/0263936 | A1 * | 11/2006 | Hsu | 438/108 |

* cited by examiner

*Primary Examiner* — Tuan T Dinh
(74) *Attorney, Agent, or Firm* — Bracewell & Giuliani LLP; Brad Y. Chin

(57) ABSTRACT

Disclosed herein is a printed circuit board having electronic components embedded therein. The printed circuit board having electronic components embedded therein includes: a metal core layer connected to a ground terminal of an external power supply to be grounded and having a cavity or a groove part formed thereon; an electronic component accommodated in the cavity and having a plurality of terminals, a ground terminal included in the plurality of terminals being connected to the metal core layer; an internal insulating layer stacked on both sides of the metal core layer; and circuit patterns formed on an external surface of the internal insulating layer.

10 Claims, 4 Drawing Sheets

PRINTED CIRCUIT BOARD HAVING ELECTRONIC COMPONENTS EMBEDDED THEREIN

CROSS REFERENCE TO RELATED APPLICATION

This application claims the benefit of Korean Patent Application No. 10-2010-0097930, filed on Oct. 7, 2010, entitled "Printed Circuit Board Having Electronic Components Embedded Therein" which is hereby incorporated by reference in its entirety into this application.

BACKGROUND OF THE INVENTION

1. Technical Field

The present invention relates to a printed circuit board having electronic components embedded therein.

2. Description of the Related Art

Generally, a printed circuit board is manufactured by forming circuit patterns with copper clad laminate on one side or both sides of a board made of various thermosetting resins, arranging and fixing ICs or electronic components on the board, forming circuit patterns therebetween and coating it with insulating material.

In order to realize a printed circuit board including electronic components embedded therein, there exists a wide variety of surface-mounting technologies for mounting semiconductor devices such as Integrated Circuit (IC) chips on a printed circuit board. The surface-mounting technologies may include a wire bonding technology and a flip chip technology.

Among these, a surface-mounting process using the wire bonding technology is configured in a manner such that an electronic component, on which a designed circuit is printed, is bonded on a printed circuit board using adhesive, metal terminals (i.e., pads) of the electronic component are connected to lead frames of the printed circuit board via metal wires for the transmission and reception of information therebetween, and the electronic component and the wires are subjected to a molding process using thermosetting resin or thermoplastic resin.

Meanwhile, a surface-mounting process using the flip chip technology is configured in a manner such that external connecting terminals (i.e., bumps) having a size ranging from several tens to several hundreds of μm are formed on an electronic component using materials such as gold, solder and other metals, the electronic component including the bump formed thereon is flipped over so that the surface of the component faces a printed circuit board, and the electronic component is mounted on the printed circuit board on the other side, that is, flipped over, unlike the process using existing wire bonding technology.

Since these surface-mounting processes are conducted in a common manner in which an electronic component is mounted on the surface of a printed circuit board, the total thickness of the resulting product after the mounting process cannot be less than the sum of the thicknesses of the printed circuit board and the electronic component, thus making the manufacture of a high-density product difficult. In addition, since electrical connection between the electronic component and the printed circuit board is achieved using the connecting terminals (pads or bumps), the electrical connection may be damaged or may malfunction due to breakage or corrosion of the connecting terminals, thus deteriorating the reliability of the product.

For this reason, in order to overcome the above problems, electronic components are embedded inside rather than outside the printed circuit board, and a build-up layer is formed for the electrical connection, thereby achieving compact and high-density products, and avoiding deterioration in the reliability occurring at a stage of connecting components to each other in the surface-mounting process using the wire bonding technology or the flip chip technology.

In the printed circuit board having electronic components embedded therein, each of electronic components must be provided with power, which is generally supplied through the circuit patterns of the printed circuit board. In this case, a number of electronic components are mounted on the board, so that the number of the circuit patterns for supplying power is increased, thereby increasing the complexity of the circuit patterns and generating power loss.

Furthermore, in the case where the electronic components are mounted in the printed circuit board, problems related with heat generation occur, and it is hard to remove interferences in RF elements.

An existing printed circuit board having electronic components embedded therein has a multi-layer structure where ground patterns for performing grounding acts and power supply patterns for applying predetermined power to the board are separately formed among circuit patterns.

Such a printed circuit board has limits in the magnitude and design of the circuit patterns when the ground patterns and the power supply patterns are formed thereon. Therefore, the locations of the electronic components to which power must be supplied are also limited.

Furthermore, there is a problem in that, when abnormal current/voltage occurs in the printed circuit board, it is applied to the electronic components, causing damage in the electronic components.

SUMMARY OF THE INVENTION

The present invention has been made in an effort to provide a printed circuit board having electronic components embedded therein, which employs a metal core layer to improve heat radiation efficiency when an electronic component is mounted in the core layer that is connected to the ground terminal of an external power supply and grounded when power is supplied, and which is rapidly grounded to the metal core layer by connecting the ground terminal of the electronic component to the metal core layer when abnormal current/voltage occurs.

A printed circuit board having electronic components embedded therein according to a preferred embodiment of the present invention includes: a metal core layer connected to a ground terminal of an external power supply to be grounded and having a cavity formed thereon; an electronic component embedded in the cavity and having a plurality of terminals, a ground terminal included in the plurality of terminals being connected to the metal core layer; an internal insulating layer stacked on both sides of the metal core layer; and circuit patterns formed on an external surface of the internal insulating layer.

The printed circuit board having electronic components embedded therein may further include a protection layer covering the circuit patterns.

The printed circuit board having electronic components embedded therein may further include a build-up layer stacked on the circuit patterns.

The electronic component may have the plurality of terminals formed on one side thereof and the electronic component may be connected to the metal core layer on the other side thereof by conductive adhesive.

The electronic component may include a through silicon via to connect the ground terminal to the other side thereof, wherein the ground terminal is connected to the metal core layer by the conductive adhesive.

The electronic component may be a capacitor, and the ground terminal may be a negative terminal of the capacitor.

A printed circuit board having electronic components embedded therein according to another preferred embodiment of the present invention includes: a metal core layer connected to a ground terminal of an external power supply to be grounded and having a groove part formed thereon; an electronic component embedded in the groove part and having a plurality of terminals, a ground terminal included in the plurality of terminals being connected to the metal core layer; an internal insulating layer stacked on one side or both sides of the metal core layer; and circuit patterns formed on an external surface of the internal insulating layer.

The printed circuit board having electronic components embedded therein may further include a protection layer covering the circuit patterns.

The printed circuit board having electronic components embedded therein may further include a build-up layer stacked on the circuit patterns.

The electronic component may have the plurality of terminals formed on one side thereof and the electronic component may be connected to the metal core layer on the other side thereof by conductive adhesive.

The electronic component may include a through silicon via to connect the ground terminal to the other side thereof, wherein the ground terminal is connected to the metal core layer by the conductive adhesive.

The electronic component may be a capacitor, and the ground terminal may be a negative terminal of the capacitor.

DESCRIPTION OF THE PREFERRED EMBODIMENTS

Figure 1:
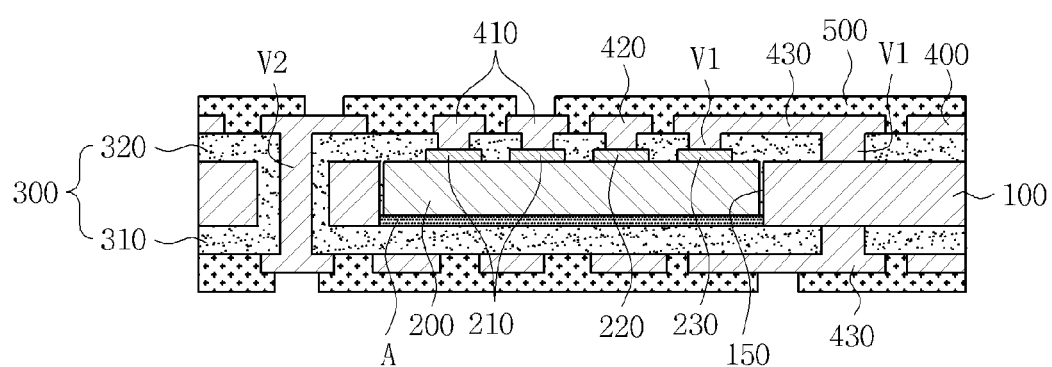
FIGS. 1 to 5 are cross-sectional views schematically showing a printed circuit board having electronic components embedded therein according to a first embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted.

Hereinafter, preferred embodiments according to the present invention will be described in detail with reference to the accompanying drawings.

FIGS. 1 to 5 are cross-sectional views schematically showing a printed circuit board having electronic components embedded therein according to a first embodiment of the present invention. The printed circuit board having electronic components embedded therein (hereinafter referred to as "a printed circuit board") according to the present invention is described with reference to the drawings.

The printed circuit board according to the present invention includes a metal core layer 100 having a cavity 150 formed thereon, an electronic component 200 embedded in the cavity 150, an insulating layer 300 formed on both sides of the metal core layer 100, and circuit patterns 400 formed on the insulating layer 300), as shown in FIG. 1.

The metal core layer 100 constitutes the base of the printed circuit board, determines the outward form thereof, determines the thickness of the printed circuit board, and improves rigidity. The metal core layer 100 may be made of various types of metals, such as magnesium (Mg), titanium (Ti), hafnium (Hf), zinc (Zn) or the like, but may be preferably made of aluminum or aluminum alloy. Aluminum is light weight material, and therefore can reduce the entire weight of a heat-radiating plate.

The metal core layer 100 has higher heat transfer efficiency unlike a general resin core layer, and therefore, has an advantage of having excellent heat radiation efficiency upon the accommodation of the electronic component.

Therefore, the metal core layer 100 is connected to the ground terminal of an external power supply and is grounded. An existing printed circuit board is connected to the power supply terminal and ground terminal of an external power supply through circuit patterns and power is applied to the printed circuit board. The circuit patterns formed on the existing printed circuit board has a very complicated configuration since not only signal patterns and but also power supply patterns and ground patterns are formed between a number of electronic components when the electronic components are mounted thereon.

According to the present invention, the ground patterns are formed on the entire printed circuit board by grounding the metal core layer 100, so that when the circuit patterns are formed, some of the ground patterns are removed or the metal core layer is connected by a via thereby minimizing the number of ground patterns and thus increasing the degree of freedom in design.

Therefore, the cavity 150 is formed in the metal core layer 100 in order to accommodate the electronic component 200 as described below. The cavity 150 is formed by performing a drilling process, laser beam machining, or an etching process on the metal core layer 100.

The electronic component 200 accommodated in the cavity 150 may be an active element, such as a semiconductor element, or a passive element, such as a capacitor.

In this case, the electronic component 200 is connected to the circuit patterns of the printed circuit board, and a number of terminals, including signal terminals 210 through which a signal is transmitted and received, a power supply terminal 220 to which power is applied and a ground terminal 230 which is grounded are formed. In the present invention, the ground terminal 230 of the electronic component 200 is connected to the metal core layer 100 that is grounded.

As shown in FIG. 1, it can be connected via the circuit patterns 400. Unlike printed circuit boards according to the prior art, the configuration of the printed circuit board is simplified using the metal core layer 100 without separately forming a ground layer, and the metal core layer 100 is close to the electronic component 200 and surrounds it, thereby minimizing the length of the circuit patterns 400 connecting the metal core layer 100 with the electronic component 200.

Figure 2:
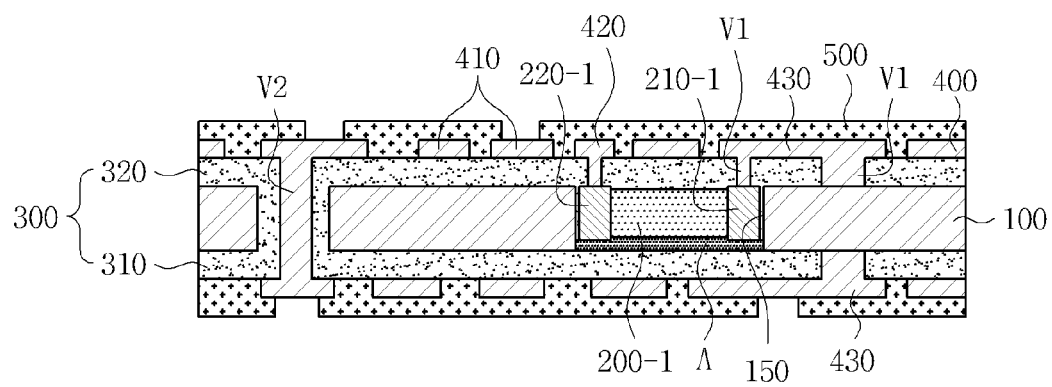

In this case, as shown in FIG. 2, when a capacitor 200-1 is employed as the electronic component 200, the capacitor includes a negative terminal 210-1 and a positive terminal 220-1, so that the negative terminal 210-1 of the capacitor is connected to the metal core layer 100.

The internal insulating layer 300 is stacked on both sides of the metal core layer 100 in which the electronic component 200 is embedded. When the printed circuit board is configured to be multilayered, the insulating layer contacted with the metal core layer 100 is referred to as "an internal insulating layer" in this specification in order to discriminate it from other insulating layers.

As the internal insulating layer 300, prepreg that is a resin layer made of phenolic resin, epoxy resin, imide resin or the like, or a resin layer including reinforcement is employed.

As shown in FIG. 1, when the internal insulating layer 300 is formed on both sides of the metal core layer 100, manufacture is performed in such a way that the metal core layer 100 in which the cavity 150 is formed is stacked on the lower internal insulating layer 310, the electronic component 200 is mounted on the cavity 150 and the upper internal insulating layer 320 is stacked thereon.

In this case, in order to prevent the electronic component from being moved or damaged in the process of manufacturing the printed circuit board, the electronic component 200 is fixed to the lower internal insulating layer 310 using adhesive, and then post processing is performed. More particularly, the metal core layer 100 in which the cavity 150 is formed is stacked on the lower internal insulating layer 310, then an adhesive layer is formed on the bottom surface of the cavity 150 using resin adhesive A, and the electronic component 200 is mounted on the cavity 150 such that the lower surface thereof is adhered to the adhesive layer.

The circuit patterns 400 are formed in the outer surface of the internal insulating layer 300. As shown in FIG. 1, the circuit patterns may be formed on both sides thereof or only one side (in FIG. 1, the upper internal insulating layer) in which the terminal of the electronic component 200 is formed. The circuit patterns 400 may include signal patterns 410 for delivery of signals, power supply patterns 420 to which power is applied, and ground patterns 430 connected to the metal core layer 100.

The circuit patterns 400 are connected to the electronic component 200, the signal patterns 410 are connected to the signal terminals 210 and the power supply patterns 420 are connected to the power supply terminal 220.

In this case, the ground patterns 430 may be connected to the metal core layer 100 and the ground terminal 230 of the electronic component 200. However, since a number of ground patterns 430 is included in the circuit patterns 400, all of the ground patterns 430 are not used for the purpose of connecting the ground terminal 230 of the electronic component 200 and some thereof are used for the purpose of connecting the metal core layer 100 and other circuit patterns.

The circuit patterns may be formed using conventional Semi-Additive Process (SAP), Modified Semi-Additive Process (MSAP), subtractive method, etc.

The circuit patterns 400 may be defined including a first via v1 connected to the terminal of the electronic component 200 or the metal core layer 100, and the first via v1 is formed by forming a through hole using a YAG laser or a $CO_2$ laser and then forming a plating layer on the internal wall of the through hole using the above-described process.

Furthermore, the circuit patterns 400 respectively formed on the lower internal insulating layer 310 and the upper internal insulating layer 320 can also be coupled to each other through a second via v2. Insulating material is formed on the internal wall of the through hole such that the second via v2 is not shorted by the metal core layer 100.

When the metal core layer 100 in which a through hole is formed in order to form the cavity 150 and the second via v2 is stacked on the lower internal insulating layer 310 and then the upper internal insulating layer is stacked thereon, the through hole for the formation of the second via v2 is filled with insulating material. In this case, a through hole is again formed such that the insulating material remains in the internal wall thereof, and then the second via v2 is formed according to a process of forming the circuit patterns 400.

Furthermore, the printed circuit board according to the present invention further includes a protection layer 500 for covering the circuit patterns 400. A problem occurs in that the circuit patterns 400 exposed to the outside are in contact with other material or physical damage occurs thereby causing shorting of circuit patterns or misconnection. Specially, in the case where the electronic component 200 is mounted, a solder may be connected to an undesired region. The protection layer 500 is formed to cover the circuit patterns 400 in order to resolve the problem.

Solder resist is employed as the protection layer 500, which may be formed using one of a screen printing method, a roller coating method, a curtain coating method, a spray coating method. The protection layer 500 is made of heat resistant resin that sufficiently resists a temperature at which the solder can be melted.

When the circuit patterns 400 include a pad part, the protection layer 500 is formed to have an opening part for exposing the pad part.

Figure 3:
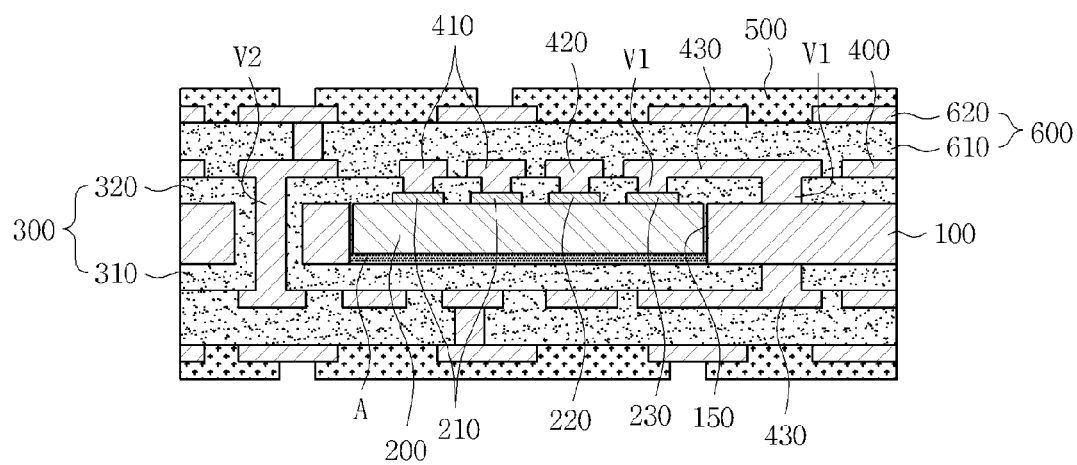

Furthermore, as shown in FIG. 3, a build-up layer 600 stacked on the circuit patterns 400 may be further included. The printed circuit board including the build-up layer 600 becomes a multi-layer printed circuit board.

The build-up layer 600 is manufactured by repeating a process of stacking an insulating layer 610 on the circuit patterns 400 and then forming another circuit pattern 620 using a plating or printing method or the like. More particularly, the build-up layer 600 is implemented by stacking a separate insulating material, forming a via hole using a YAG laser or a $CO_2$ laser and then forming the circuit patterns including a via by a Semi-Additive Process (SAP), a Modified Semi-Additive Process (MSAP), or the like.

Meanwhile, the build-up layer 600 is formed on both sides of the metal core layer 100 in FIG. 3 but it is not necessary to form it on both sides, and thus, the build-up layer may be formed on any one side, which is included in the scope of the present invention.

Furthermore, the build-up layer 600 including the insulating layer 610 of one layer and the circuit pattern 620 of one layer is shown in FIG. 2 on both sides of the printed circuit board, but it is only one example, and the number of layers implemented may vary.

Furthermore, in the case in which the build-up layer 600 is further included, the protection layer 500 is formed to cover the circuit pattern 620 that is the most-external layer.

Figure 4:
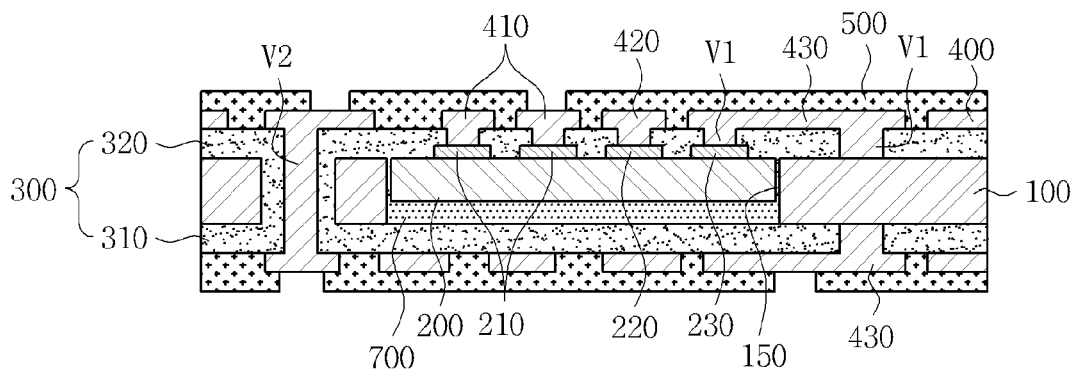

In the printed circuit board according to the present embodiment, the electronic component 200 has the plurality of terminals formed on one side thereof and the electronic component 200 is connected to the metal core layer 100 on the other side by conductive adhesive 700, as shown in FIG. 4.

The conductive adhesive 700 is metal adhesive having electric conductivity (for example, silver paste and resin adhesive including metal particles such as silver) unlike conventional resin adhesive and has excellent heat conductivity compared to resin adhesive, thereby improving heat radiation efficiency even if the electronic component is embedded.

The metal core layer 100 in which cavity 150 is formed is stacked on the lower internal insulating layer 310, the adhesive layer is then formed on the bottom surface of the cavity 150 with the conductive adhesive 700, and the electronic component 200 is embedded in the cavity 150 to be connected thereto using the adhesive layer. In this case, when the conductive adhesive 700 is coated to come in contact with the inner wall of the cavity 150, the heat generated from the electronic component 200 is directly transferred to the metal core layer 100 through the conductive adhesive 700 thereby improving heat radiation efficiency.

Figure 5:
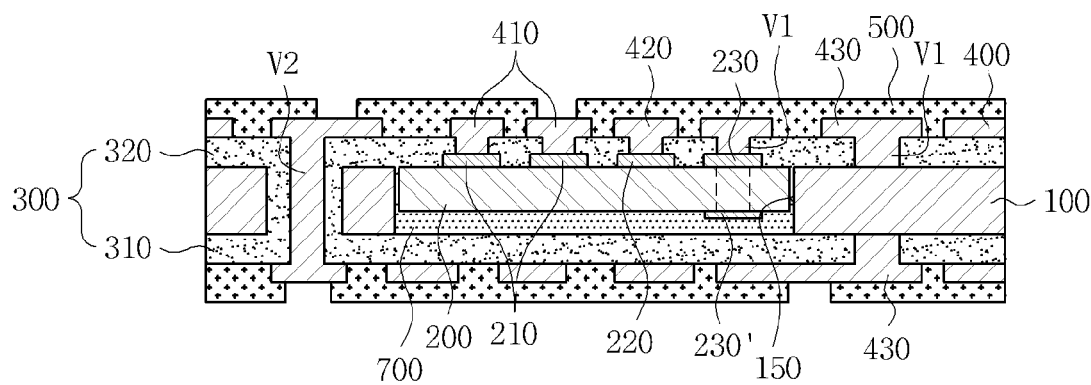

In this case, as shown in FIG. 5, the electronic component 200' may include a through silicon via (TSV) to connect the ground terminal 230' to the other surface, wherein the ground terminal 230' may be connected to the metal core layer 100 through the conductive adhesive 700.

The electronic component formed with the TSV has an advantage in that power and signals are input and output on the both sides of the electronic component unlike the case in which terminals are formed on one side. The electric component formed with the TSV is known in the art, and thus the details thereof are omitted.

Provided that in the electronic component 200' employed in the present invention, the ground terminal 230' among the plurality of terminals is only formed on the other surface thereof.

Furthermore, by connecting to the metal core layer 100 through the conductive adhesive 700, it is advantageous in that the ground terminal 230' of the electronic component 200' is directly connected to the metal core layer 100 without requiring the connection of the ground patterns 430 as shown in FIG. 5.

Figure 6:
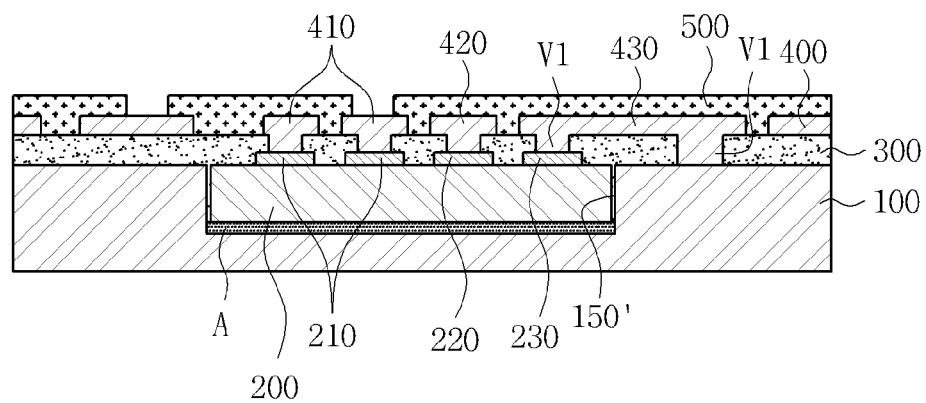
FIGS. 6 to 8 are cross-sectional views showing schematically a printed circuit board having electronic components embedded therein according to a second embodiment of the present invention.
Figure 7:
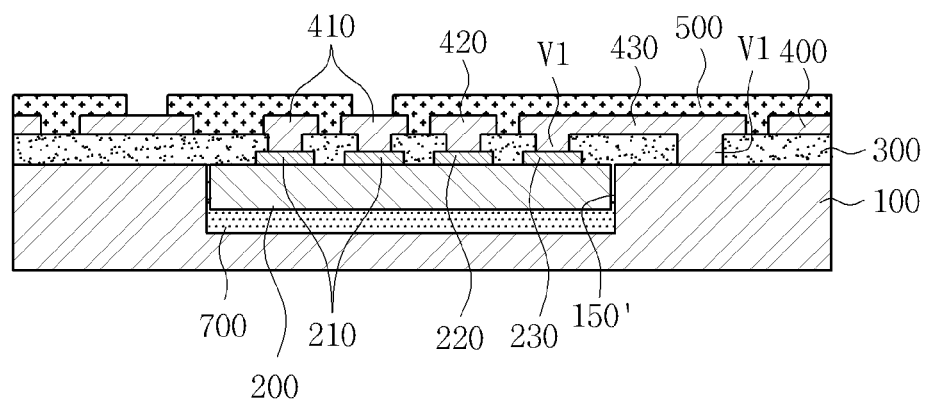
Figure 8:
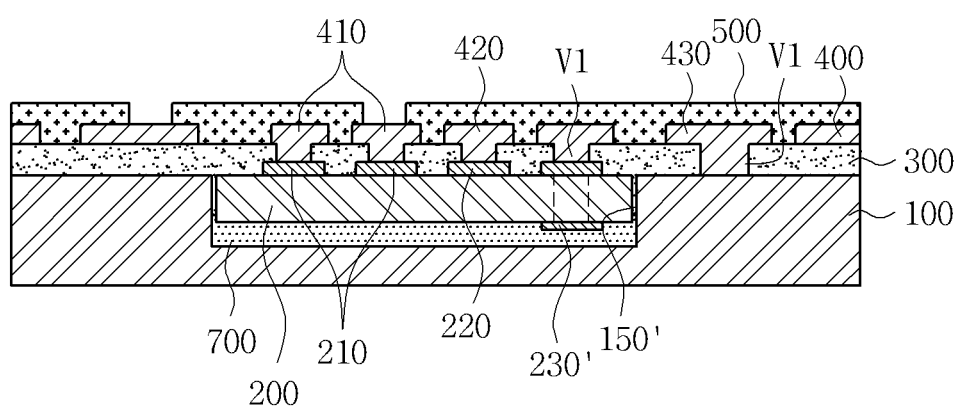

FIGS. 6 to 8 are cross-sectional views schematically showing a printed circuit board having electronic components embedded therein according to a second embodiment of the present invention. The printed circuit board having electronic components embedded therein (hereinafter referred to as "a printed circuit board") according to the present invention is described with reference to the drawings. It should be noted that details of the same configurations as the printed circuit board having electronic components embedded therein according to the first embodiment as described with reference to FIGS. 1 to 5 above are omitted.

In the printed circuit board according to the present embodiment, a metal core layer 100 is connected to the ground terminal of an external power supply and is grounded, and a groove part 150' is formed to accommodate the electronic component unlike the first embodiment.

Furthermore, the electronic component 200 is embedded in the groove part 150' and the internal insulating layer 300 is stacked on one side or both sides of the metal core layer 100.

In the printed circuit board according to the present embodiment, since the electronic component 200 is mounted in the bottom surface of the groove part 150' formed on the metal core layer 100, the electronic component 200 can be stably mounted and the area in which the electronic component is in contact with the metal core layer 100 increases, thereby improving heat radiation efficiency.

Furthermore, since the lower internal insulating layer 310 does not have a structure to support the electronic component 200 unlike the first embodiment, the internal insulating layer 300 can be formed only on the upper portion of the metal core layer 100.

When the circuit patterns 400 are formed on both sides, it is natural to form the internal insulating layer 300 on the lower portion of the metal core layer 100. In this case, the second via v2 (see FIG. 1) is formed in order to connect the circuit patterns on both sides to each other.

In the printed circuit board according to the present embodiment, in the case in which the electronic component 200 is embedded in the groove part 150', resin adhesive or the like is coated on the bottom surface of the groove part 150', and the lower surface of the electronic component 200 is accommodated so as to be mounted on the adhesive.

In this case, as shown in FIG. 7, when conductive adhesive 700 is coated, heat transfer ability is improved and therefore heat radiation efficiency is improved. Furthermore, as shown in FIG. 8, the electronic component 200', the ground terminal 230' among the plurality of terminals of which is formed on the other surface may be employed.

Furthermore, although not shown, the capacitor 200-1 may be employed as the electronic component 200 and the build-up layer 600 may be further included as in the printed circuit board according to the first embodiment.

The present invention employs the core layer made of a metal member, thereby improving heat radiation efficiency even in mounting electronic components.

Furthermore, according to the present invention, the metal core layer is grounded and the ground terminal of the electronic component is connected to the metal core layer, thereby simplifying the ground patterns and thus reducing limits in the design of the printed circuit board.

Furthermore, the electronic component can be protected by directly connecting the ground terminal of the electronic component to the grounded metal core layer even if abnormal current/voltage occurs.

Although the embodiments of the present invention regarding the touch panel have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A printed circuit board having electronic components embedded therein, comprising:
   a metal core layer having a cavity formed thereon;
   an electronic component embedded in the cavity and having a plurality of terminals, a first ground terminal included in the plurality of terminals being connected to the metal core layer;
   a first internal insulating layer stacked on one side of the metal core layer;
   a second internal insulating layer stacked on the other side of the metal core layer;
   a first circuit pattern formed on an external surface of the first internal insulating layer; and
   a second circuit pattern formed on an external surface of the second internal insulating layer,
   wherein the electronic component includes a through silicon via and has the first ground terminal being connected to a second ground terminal by the through silicon via and the second ground terminal formed on the other side thereof, wherein the second ground terminal is connected to the metal core layer by conductive adhesive, and wherein the conductive adhesive is formed between a lower surface of the electronic component and the second internal insulating layer, a side of the conductive adhesive is connected to the metal core layer, and the conductive adhesive is electrically connected to the second ground terminal with the metal core layer.

2. The printed circuit hoard having electronic components embedded therein as set forth in claim 1, further comprising a protection layer covering the circuit patterns.

3. The printed circuit hoard having electronic components embedded therein as set forth in claim 1, further comprising a build-up layer stacked on the circuit patterns.

4. The printed circuit hoard having electronic components embedded therein as set forth in claim 1, wherein the electronic component is a capacitor, and the first ground terminal is a negative terminal of the capacitor.

5. The printed circuit board having electronic components embedded therein as set forth in claim 1, wherein the metal core layer has a through hole filled with insulating material and further includes a via passing through the first internal insulating layer, the insulating material and the second internal insulating layer, and wherein the insulating material is formed between the metal core layer and the via, the via electrically connecting the first circuit pattern to the second circuit pattern and is insulated from the metal core layer by the insulating material.

6. A printed circuit board having electronic components embedded therein, comprising:

a metal core layer having a groove part formed thereon;

an electronic component embedded in the groove part and having a plurality of terminals, a ground terminal included in the plurality of terminals being connected to the metal core layer;

a first internal insulating layer stacked on one side of the metal core layer;

a second internal insulating layer stacked on the other side of the metal core layer;

a first circuit pattern formed on an external surface of the first internal insulating layer; and a second circuit pattern formed on an external surface of the second internal insulating layer, wherein the electronic component includes a through silicon via and has the first ground terminal being connected to a second ground terminal by the through silicon via and the second ground terminal formed on the other side thereof, wherein the second ground terminal is connected to the metal core layer by conductive adhesive, and wherein the conductive adhesive is formed between a lower surface of the electronic component and the second internal insulating layer, a side of the conductive adhesive is connected to the metal core layer, and the conductive adhesive is electrically connected to the second ground terminal with the metal core layer.

7. The printed circuit board having electronic components embedded therein as set forth in claim 6, further comprising a protection layer covering the circuit patterns.

8. The printed circuit board having electronic components embedded therein as set forth in claim 6, further comprising a build-up layer stacked on the circuit patterns.

9. The printed circuit board having electronic components embedded therein as set forth in claim 6, wherein the electronic component is a capacitor, and the ground terminal is a negative terminal of the capacitor.

10. A printed circuit board having electronic components embedded therein, comprising:

a metal core layer having a cavity formed thereon;

an electronic component embedded in the cavity and having a plurality of terminals, a first ground terminal included in the plurality of terminals being connected to the metal core layer;

a first internal insulating layer stacked on one side of the metal core layer;

a second internal insulating layer stacked on the other side of the metal core layer;

a first circuit pattern formed on an external surface of the first internal insulating layers; and a second circuit pattern formed on an external surface of the second internal insulating layer, wherein the metal core layer has a through hole filled with insulating material and further includes a via passing through the first internal insulating layer, the insulating material and the second internal insulating layer, and wherein the insulating material is formed between the metal core layer and the via, the via electrically connecting the first circuit pattern to the second circuit pattern and is insulated from the metal core layer by the insulating material.

* * * * *